(12) United States Patent
Sturrock et al.

(10) Patent No.: US 8,069,021 B2
(45) Date of Patent: Nov. 29, 2011

(54) DISTRIBUTED SIMULATION AND SYNCHRONIZATION

(75) Inventors: David Thayer Sturrock, Evans City, PA (US); Glenn Richardson Drake, Panama City (PA); Cory R. Crooks, Moon Township, PA (US); A. David Takus, Sewickley, PA (US); Mark Anson Glavach, Slippery Rock, PA (US); Genevieve O'Neill Kolt, Painesville, OH (US); Frank Anthony Palmieri, Jr., Gibsonia, PA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 846 days.

(21) Appl. No.: 11/864,620

(22) Filed: Sep. 28, 2007

(65) Prior Publication Data

US 2009/0089030 A1   Apr. 2, 2009

(51) Int. Cl.
*G06F 9/455* (2006.01)

(52) U.S. Cl. ............... 703/6; 706/10; 703/13; 718/104; 709/201

(58) Field of Classification Search .................. 703/13, 703/6, 11, 7, 22, 2, 21; 705/1; 706/10; 717/104, 717/109; 716/21; 700/245; 345/156; 701/3; 714/724; 718/104; 709/201
See application file for complete search history.

(56) References Cited

U.S. PATENT DOCUMENTS

| | | | |
|---|---|---|---|
| 4,167,821 A | 9/1979 | Gibson, Jr. et al. | |
| 4,385,349 A | 5/1983 | Ashford et al. | |
| 4,613,952 A | 9/1986 | McClanahan | |
| 4,630,189 A | 12/1986 | Ohmori et al. | |
| 4,755,925 A | 7/1988 | Tsuchiya et al. | |
| 5,252,268 A | 10/1993 | Ohno | |
| 5,375,448 A | 12/1994 | Katayama et al. | |
| 5,394,322 A | 2/1995 | Hansen | |
| 5,402,333 A | 3/1995 | Cardner | |
| 5,436,855 A | 7/1995 | Willafys et al. | |
| 5,446,870 A * | 8/1995 | Hinsberg et al. | 703/6 |
| 5,455,763 A | 10/1995 | Feingold | |
| 5,727,128 A | 3/1998 | Morrison | |
| 5,752,008 A | 5/1998 | Bowling | |
| 5,848,393 A | 12/1998 | Goodridge et al. | |
| 5,997,167 A | 12/1999 | Crater et al. | |
| 5,999,734 A | 12/1999 | Willis et al. | |
| 6,088,689 A * | 7/2000 | Kohn et al. | 706/10 |
| 6,108,662 A | 8/2000 | Hoskins et al. | |
| 6,112,312 A | 8/2000 | Parker et al. | |
| 6,321,181 B1 * | 11/2001 | Havens | 703/13 |
| 6,345,240 B1 * | 2/2002 | Havens | 703/21 |
| 6,353,904 B1 | 3/2002 | Le | |
| 6,498,968 B1 * | 12/2002 | Bush | 701/3 |

(Continued)

OTHER PUBLICATIONS

OA mailed Dec. 10, 2010 for U.S. Appl. No. 11/864,693, 15 pages.

(Continued)

*Primary Examiner* — Kandasamy Thangavelu
(74) *Attorney, Agent, or Firm* — Turocy & Watson, LLP

(57) ABSTRACT

System(s) and method(s) facilitate a distributed simulation of an industrial control system. A model of the industrial control system is generated and computing resources are scheduled for simulating portions of a simulation according to the model. Computing resources are scheduled to mitigate computational bottlenecks in the simulation and synchronize portions of the simulation deployed in disparate computing resources. Sub-processes of a control process can be simulated in dedicated computing resources as a part of a distributed simulation of the control process. Execution time of one or more portions of a distributed simulation can be increased or slowed down to synchronize said portions.

18 Claims, 10 Drawing Sheets

U.S. PATENT DOCUMENTS

| | | |
|---|---|---|
| 6,529,780 B1 | 3/2003 | Soergel et al. |
| 6,789,054 B1 * | 9/2004 | Makhlouf ................... 703/6 |
| 6,802,045 B1 | 10/2004 | Sonderman et al. |
| 6,826,518 B1 * | 11/2004 | Ivezic et al. ................ 703/6 |
| 6,868,373 B2 | 3/2005 | Fehn |
| 6,901,308 B1 | 5/2005 | Hamada et al. |
| 6,941,249 B1 | 9/2005 | Miller et al. |
| 6,985,779 B2 | 1/2006 | Hsiung et al. |
| 7,010,364 B1 | 3/2006 | Singh et al. |
| 7,082,348 B1 | 7/2006 | Dahlquist et al. |
| 7,110,929 B1 | 9/2006 | Meares |
| 7,117,261 B2 | 10/2006 | Kryskow et al. |
| 7,136,716 B2 | 11/2006 | Hsiung et al. |
| 7,158,112 B2 * | 1/2007 | Rosenberg et al. .......... 345/156 |
| 7,218,974 B2 | 5/2007 | Rumi et al. |
| 7,239,991 B2 | 7/2007 | Tuszynski |
| 7,257,451 B2 | 8/2007 | Carpency et al. |
| 7,263,462 B2 | 8/2007 | Funge et al. |
| 7,315,826 B1 | 1/2008 | Guheen et al. |
| 7,546,602 B2 | 6/2009 | Hejlsberg et al. |
| 7,558,698 B2 | 7/2009 | Funge et al. |
| 7,747,422 B1 | 6/2010 | Sisley |
| 7,821,656 B2 * | 10/2010 | Ito et al. ................ 358/1.1 |
| 2001/0056339 A1 | 12/2001 | Robinson et al. |
| 2002/0091990 A1 | 7/2002 | Little et al. |
| 2002/0120352 A1 | 8/2002 | Stothert et al. |
| 2002/0129019 A1 | 9/2002 | O'Brien |
| 2003/0061004 A1 | 3/2003 | Discenzo |
| 2003/0079207 A1 | 4/2003 | Xavier et al. |
| 2003/0167454 A1 * | 9/2003 | Iordanov et al. ............. 717/104 |
| 2004/0034555 A1 | 2/2004 | Dismukes et al. |
| 2004/0049295 A1 | 3/2004 | Wojsznis et al. |
| 2004/0064253 A1 | 4/2004 | Brayton et al. |
| 2004/0102940 A1 * | 5/2004 | Lendermann et al. ........... 703/6 |
| 2004/0114609 A1 | 6/2004 | Swarbrick et al. |
| 2004/0153437 A1 | 8/2004 | Buchan |
| 2004/0199360 A1 | 10/2004 | Friman et al. |
| 2004/0230945 A1 | 11/2004 | Bryant et al. |
| 2005/0071139 A1 | 3/2005 | Patwardhan et al. |
| 2005/0125629 A1 | 6/2005 | Kissell |
| 2005/0154476 A1 | 7/2005 | Gallestey et al. |
| 2005/0216234 A1 | 9/2005 | Glas et al. |
| 2005/0246712 A1 | 11/2005 | Ferris |
| 2005/0249196 A1 | 11/2005 | Ansari et al. |
| 2005/0251291 A1 * | 11/2005 | Solomon ................. 700/245 |
| 2005/0256692 A1 | 11/2005 | Monin et al. |
| 2005/0257195 A1 * | 11/2005 | Morrow et al. ............ 717/109 |
| 2005/0273305 A1 * | 12/2005 | Thalhammer-Reyero ...... 703/11 |
| 2006/0058976 A1 | 3/2006 | Ferris |
| 2006/0149582 A1 * | 7/2006 | Hawkins ...................... 705/1 |
| 2006/0167667 A1 * | 7/2006 | Maturana et al. .............. 703/6 |
| 2006/0174221 A1 | 8/2006 | Kinsella et al. |
| 2006/0184254 A1 | 8/2006 | Carpency et al. |
| 2006/0277016 A1 | 12/2006 | Kouchi et al. |
| 2007/0022402 A1 * | 1/2007 | Ye et al. ..................... 716/21 |
| 2007/0124461 A1 | 5/2007 | Kryskow et al. |
| 2007/0168789 A1 * | 7/2007 | Udell ....................... 714/724 |
| 2007/0268847 A1 | 11/2007 | Schiffer et al. |
| 2007/0277151 A1 | 11/2007 | Brunel et al. |
| 2007/0283358 A1 * | 12/2007 | Kasahara et al. ............. 718/104 |
| 2007/0294496 A1 | 12/2007 | Goss et al. |
| 2008/0027704 A1 * | 1/2008 | Kephart et al. ............... 703/22 |
| 2008/0066004 A1 | 3/2008 | Blevins et al. |
| 2008/0235317 A1 * | 9/2008 | Burgmans ................... 709/201 |
| 2008/0281824 A1 | 11/2008 | Rangadass et al. |
| 2009/0089029 A1 * | 4/2009 | Sturrock et al. ................ 703/7 |
| 2009/0254572 A1 | 10/2009 | Redlich et al. |

OTHER PUBLICATIONS

OA mailed Dec. 1, 2009 for U.S. Appl. No. 11/864,685, 13 pages.
OA mailed Jun. 9, 2010 for U.S. Appl. No. 11/864,701, 31 pages.
OA dated Oct. 25, 2010 for U.S. Appl. No. 11/864,701, 19 pages.
OA dated Oct. 7, 2010 for U.S. Appl. No. 11/864,451, 26 pages.
OA Dated Oct. 8, 2010 for U.S. Appl. No. 11/864,679, 29 pages.
OA dated May 11, 2011 for U.S. Appl. No. 11/864,451, 29 pages.
OA dated Jun. 8, 2011 for U.S. Appl. No. 11/864,568, 50 pages.

* cited by examiner

DISTRIBUTED SIMULATION AND SYNCHRONIZATION

TECHNICAL FIELD

The claimed subject matter relates generally to industrial control systems, and more particularly to simulation and synchronization of industrial control processes in a distributed platform.

BACKGROUND

Simulation and modeling for automation has advanced considerably. In one instance, manufacturers employ simulation for business purposes. While some have utilized simulation to close sales with suppliers, other manufacturers employ simulation for supply chain planning. For example, if it is known how many items are produced for a given line, then it can be determined where production needs to occur and what equipment needs to drive the production while yielding confidence in the final production outcome. Entities can also predict delivery schedules from simulations. Design engineers are using simulation to alter their designs to make products easier to manufacture, whereas many companies are now creating simulations of entire plants before a plant is built or refurbished.

One recent trend is the use of simulation to train plant personnel. There are two main areas where simulation has helped in training. In one, simulation allows less skilled workers to practice and gain experience "operating" plant equipment before taking the reins in the real world. In another, simulated operation offers an accelerated form of training. For instance, input/output (I/O) simulation software provides a shortcut to training on actual equipment that may not even be available at the present time, where training materials can be created from simulated manufacturing design. Training is often considered a secondary use of simulation, but the savings it produces can be considerable nonetheless. Another recent development in simulation mirrors progress in other areas of computer technology: standardization of data. One of the trends in simulation is the ability to share data. Thus, users share data in many directions, from product design and manufacturing to robot simulation and ergonomics, for example.

Three-dimensional modeling has gained ground in manufacturing simulation. Three-dimensional modeling first was applied in the aerospace and automotive sectors. Often, designers model robots in 3-D, then select the location for the respective operation such as "weld" and instruct the robot to perform along those lines. As for parameters such as pressure and the robot's maneuverability, such parameters can be built into the simulation and delivered by the robot manufacturer, thus preventing a simulation from inadvertently instructing the robot to perform an operation that is beyond its capabilities. Often times the robots are controlled from one or more programmable controllers that can also be simulated.

When a company has its manufacturing process fully simulated, it becomes easier to analyze a product design and observe how well it performs in a manufacturing setting. Since the design and manufacturing are not yet "live," there is an opportunity to turn back to the design engineer and request changes before it is cost prohibitive to do so. Such changes at the simulation stage are generally much less costly to implement than at the actual manufacturing stage. Thus, early on in the life of the product, designers can analyze the simulated manufacturing process, and adjust a given product for desired manufacturability. The ability to alter a product design prior to manufacturing in order to cause the entire process to work more efficiently offers significant potential savings over the traditional design process. This process is often referred to as front-loading, where a designer can identify glitches in manufacturing through simulation and then facilitate planning on how to overcome such problems. With front-loading, products can be designed so it performs well in the manufacturing simulation which should mitigate problems in actual production thus mitigating overall system costs.

Simulation can also be implemented end-to-end, thus demonstrating how every process in a plant performs together over a designated period of time. For instance, simulation can occur from the IC (industrial controller) level up to warehouse management and other supervisory systems. One area where simulations of the entire plant are taking hold is with new plants or newly refitted plants. Before manufacturers determine what equipment they need and where it should go, they simulate the plant's entire operations. Dynamic simulation thus provides a model for a new plant to ensure the plant is designed properly.

It should be appreciated that such end-to-end simulations are complex. Several time scales and spatial scales associated with equipment, devices, and controllers are involved. The number of components that a simulation addresses grows as new elements of the industrial environment are incorporated; however, not only the size of the system increases but also its complexity through interactions of the added components. In addition, as industrial processes modernize and economical pressures drive development, simulations are sought as instruments for predicting performance, throughput, and cost of an industrial environment as a whole, from the bottom-up, starting at the device and controller level. In several instances, decision-making is based on simulation; therefore, predictive power and incorporation of the complexity of a simulated plant or factory.

With complex industrial control systems, there is a need to simulate the various components that makeup such systems. For example, this can include simulating multiple controllers over a network where each controller in turn controls subordinate I/O modules. Many times, multiple designers are involved where one designer will design one portion of the control system and other portions are implemented by other designers. In order to simulate an overall system model, there is a need to simulate and coordinate distributed components of the system.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

System(s) and method(s) facilitate a distributed simulation of an industrial control system. A scenario describing relationships among components of an industrial control system is utilized to generate a model for simulating the system in a distributed computing platform. In addition, code based on modules can be generated for a distributed simulation of the model. Code generation can include redesigning a legacy set of modules to attain an optimal logic in the industrial process delineated in the scenario. Computational resources of such distributed computing platform are scheduled for simulating portions of a distributed simulation according to the model. Data relevant to conducting the simulation, and results generated by the simulation are coordinated among different portions of the distributed simulation. Simulation output is conveyed to a display component for analysis, reporting, decision making, and so on.

Other aspects of the claimed subject matter include the following. (i) Computing resources are scheduled to mitigate computational bottlenecks in the simulation, which may arise due to excessive data dependence in the model, and synchronize portions of the simulation deployed in disparate computing resources. (ii) Sub-processes of a control process are simulated in dedicated computing resources as a part of a distributed simulation of the control process. Such sub-processes are typically conducted by devices and controllers that present significant operational interaction among them, but only marginal operational interaction with disparate portions (e.g., other sub-process) of the industrial control system. (iii) Execution time of one or more portions of a distributed simulation can be increased or slowed down to synchronize said portions. Such time management relies on an algorithm based on control feedback and an adaptive time step for describing state transitions.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
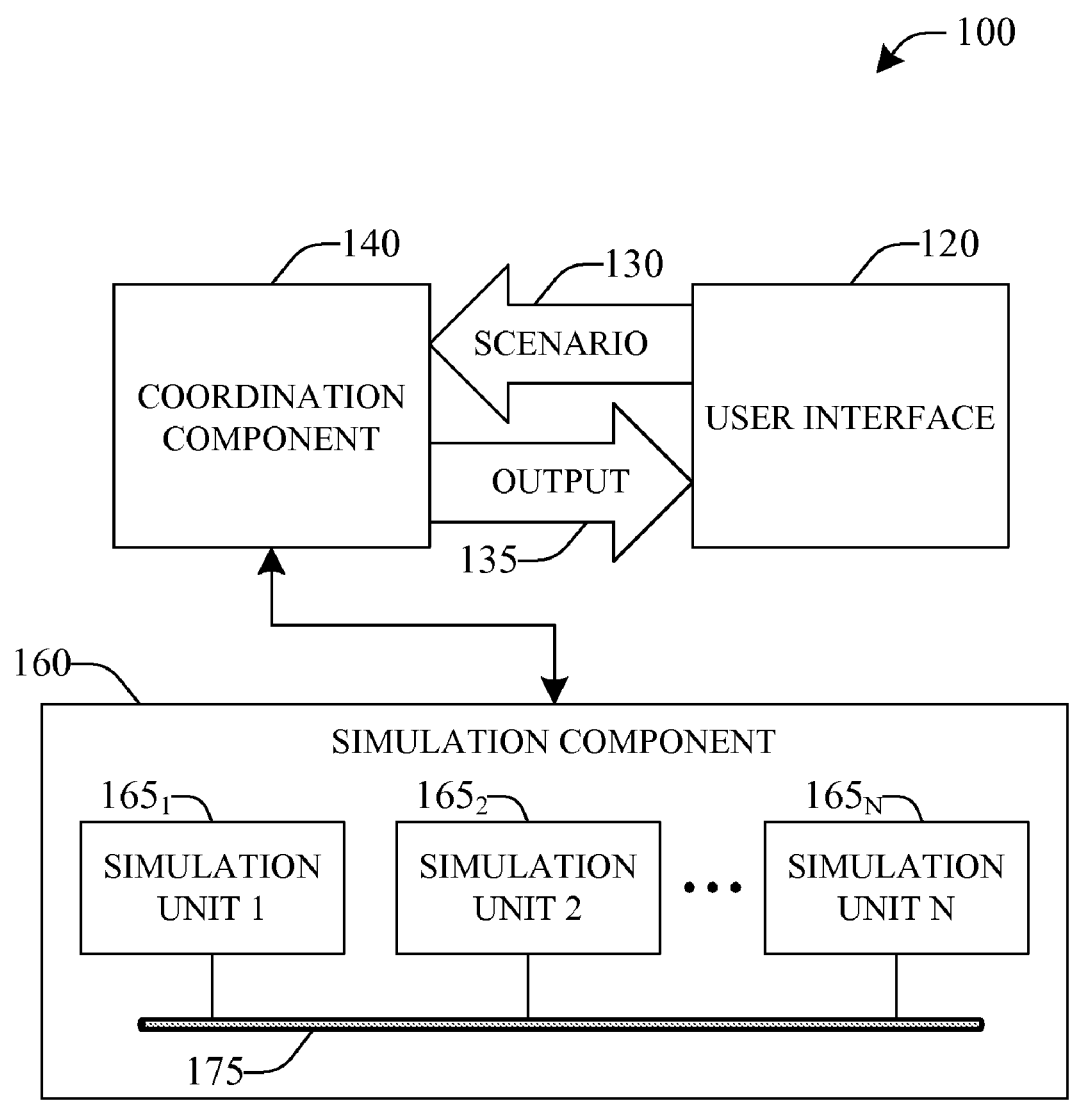
FIG. 1 illustrates a block diagram of an example system that facilitates distributed simulation.

The subject innovation is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the subject innovation.

It is noted that as used in this application, terms such as "component," "module," "model," and the like are intended to refer to a computer-related entity, either hardware, a combination of hardware and software, software, or software in execution as applied to an automation system for industrial control. For example, a component may be, but is not limited to being, a process running on a processor, a processor, an object, an executable, a thread of execution, a program and a computer. By way of illustration, both an application running on a server and the server can be components. One or more components may reside within a process and/or thread of execution and a component may be localized on one computer and/or distributed between two or more computers, industrial controllers, and/or modules communicating therewith.

Described herein below are system(s) and method(s) that facilitate a distributed simulation of an industrial control system. A scenario describing relationships among components of an industrial control system is employed to generate a model for simulating the industrial control system in a distributed computing platform. A component coordinates a simulation by deploying portions thereof throughout distributed computing resources that simultaneously execute said portions and are available to the distributed computing platform. Computing resources of such platform are scheduled for simulating portions of a simulation according to the model. Data generated by the simulation is coordinated among different portions of the simulations. Computing resources are scheduled to mitigate computational bottlenecks in the simulation and synchronize portions of the simulation deployed in disparate computing resources. Sub-processes of a control process are simulated in dedicated computing resources as a part of a distributed simulation of the control process. Execution time of one or more portions of a distributed simulation can be increased or slowed down to synchronize said portions.

FIG. 1 illustrates an example system 100 that facilitates distributed simulation. A user interface 120 allows a user to characterize a scenario 130 to be simulated. Scenarios are generic entities that typically represent an abstraction of a real world system to be simulated. (Scenarios are described in greater detail below.) Once a scenario 130 is available, it is conveyed to a coordination component 140, which implements the scenario into a formal (logical or mathematical) model that can be simulated. The coordination component 140 then distributes the model to a simulation component 160 that executes a simulation in a distributed manner, employing a plurality of simulation units $165_1$-$165_N$ deployed in a network 175. Once a simulation is complete, coordination component 140 conveys simulation output 135 to user interface 120.

In the context of the subject specification, a scenario (e.g., scenario 130) is set of conditions relating components (e.g., devices, controllers, input/output devices, HMIs) of an industrial control system wherein a process, e.g., a manufacturing discrete processes or an industrial batch process, is carried out by a set of devices with specific capabilities according to a process protocol (e.g., a set of directives to carry out the process). Such protocol, in turn, is maintained within operational boundaries by a controller, e.g., a digital controller, a mechanical controller, or a human operator. It should be appreciated that other scenarios are possible, such as mixtures of materials that undergo a chemical reaction to produce another material; a deposition process of an oxide-based or semiconductor-based device; or a luggage handling operation in an airport, where various level of control ensure that bags are transported and delivered accurately.

From the examples, it is readily apparent that a scenario need not be static: Stop-load-go/stop-unload-go routines are at the core luggage handling, such routines further affected by multiple aircraft arrival/departure schedules; in a deposition process of a device, shutters open and close, heaters are energized/de-energized, and electron-beam (e-beam) guns are actuated according to a deposition "recipe" with specific time intervals for each process to start and finish. Time-dependent processes can generally be abstracted into a scenario and formally described with time-dependent partial differential equations. It should be appreciated that in industrial control systems, time-dependent partial equations can be replaced by logic steps that describe states of a device or controller, where such logic steps are affected by actuators and feedback from sensors. Simulation can generally combine both descriptions, depending on the scenario to be simulated.

In industrial control processes, scenarios (e.g., scenario 130) can aim at putting forward a time dependent abstraction of the collection of devices and controllers in a particular operation condition—e.g., food processing, beverage packaging, car assembly, and so forth. In reference to FIG. 1, user interface 120 allows an operator or a client application to set up a scenario. In the case of an operator accessing user interface 120, the operator would be prompted to describe a scenario (e.g., scenario 130) by entering its logic, as well as parameters that define the scenario. For instance, in the device deposition case mentioned above, operator may enter number of shutters and e-beam guns in a coating chamber, type/number of material sources, as well as a deposition "recipe." In industrial control systems, control logic (as implemented in a programmable controller) can be entered to describe the deposition "recipe." Moreover, the operator would enter parameters that further describe the scenario, such as number of devices involved and corresponding controllers, desired tolerance for fault timers, operational temperatures of ovens in a food processing system, and other parameters that characterize the conditions in which the process is carried out. It should be appreciated that a scenario is an abstraction of an actual system, which makes the scenario flexible. While simplifications that may be involved in a scenario generally demand a certain degree of understanding of the industrial control system that the scenario relates to, after a period of training an operator can exploit the flexibility that scenarios and simulations afford-particularly in scenarios dealing with unexplored conditions and relationships among its constituents (e.g., specific/broken devices, specific/failing controllers, specific recipes, emergency/contingency conditions, absent operators, and so on).

In the case that a client application accesses user interface 120, a scenario would normally be conveyed as output of a configuration script or even as results of a previous simulation. Such results can be stored in a simulation component (e.g., component 160) or in other appropriate component such as coordination component 140.

In system 100 (FIG. 1), a scenario is cast into a computational model and distributed to simulation component 160 by coordination component 140. In an aspect, the latter can be an intermediary component, in that no substantial simulation execution is conducted therein. It should be appreciated that the distributed character of the simulation renders distribution of the computational model an important aspect of the subject innovation.

Simulation component 160 employs the received model to propagate a scenario according to model interactions among components (e.g., controllers and devices) and conditions of the scenario. Such propagation constitutes the simulation itself. A simulation elapses a period of time, which is the execution time plus configuration and communication (e.g., through network 175) time. It should be appreciated that the execution time can be longer or substantially equal to real-time propagation of the simulated scenario. It should be appreciated that as complexity of a model increases, execution time concurrently increases. Highly complex models can render a simulation non-viable, in particular in business development tasks, as the execution time can become longer than the time allotted to develop/evaluate a project, and it can be sufficiently long as to deplete a project's budget. In addition, communication overhead can introduce synchronization issues resulting in a non-viable simulation.

It is noted that as the propagation occurs according to a model interaction, a simulation is said to model the scenario. It should be appreciated that simulation component 160 can simulate simultaneously two or more components of a system (e.g., an industrial control system); such a distinction can be dictated by scenario 130 (and effected by coordination component 140). As an example, a simulation of a highly complex system can be deployed in a plurality of networked (via network 175) simulation units 1651-165N in order to execute a simulation at an increased speed and/or within a predetermined allotted time. Output 135 of the simulation is generally conveyed to user interface 120 for analysis of the scenario and/or feedback into scenario refinements, as well as decision making in connection with commissioning of projected systems (e.g., a factory, an assembly line, a change in flight schedules, a change in transport resources, addition of a coating machine for device deposition, reconfiguration of conveyor belts in a manufacturing plant, revision of recipes in a food and beverage industry, and so on). The reliability and predictive power of a simulation can largely depend on how good an abstraction of reality a scenario is (e.g., in an industrial control system, the control logic can be flawed and, as a consequence, predictions via simulation can adversely affect decision-making based there upon). Output can also be stored (see below) for further processing, such as data mining, reporting and dissemination (e.g., marketing and advertising), machine learning, and legacy models, etc.

Propagation typically corresponds to state transitions, and it generally is associated with time propagation. However, there are scenarios in which the propagation is in configuration space, e.g., a scenario associated with a molecule undergoing deformation due to the application of an external field. In process engineering, configuration space propagation can correspond to reassembling tools, or resources, in a production plant to attain a desired throughput.

It is noted that components (simulated or real) associated with the system 100 can include various computer or network components such as servers, clients, industrial controllers (ICs), communications modules, mobile computers, wireless components, control components and so forth that are capable of interacting across a network. Similarly, the term IC as used herein can include functionality that can be shared across multiple components, systems, or networks. For example, one or more ICs can communicate and cooperate with various network devices across the network. This can include substantially any type of control, communications module, computer, I/O device, sensors, Human Machine Interface (HMI)

that communicate via the network that includes control, automation, or public networks. The IC can also communicate to and control various other devices such as Input/Output modules including Analog, Digital, Programmed/Intelligent I/O modules, other programmable controllers, communications modules, sensors, output devices, and the like.

The network can include public networks such as the Internet, Intranets, and automation networks such as Control and Information Protocol (CIP) networks including DeviceNet and ControlNet. Other networks include Ethernet, DH/DH+, Remote I/O, Fieldbus, Modbus, Profibus, wireless networks, serial protocols, and so forth. In addition, the network devices can include various possibilities (hardware or software components). These include components such as switches with virtual local area network (VLAN) capability, LANs, WANs, proxies, gateways, routers, firewalls, virtual private network (VPN) devices, servers, clients, computers, configuration tools, monitoring tools, or other devices.

Figure 2:
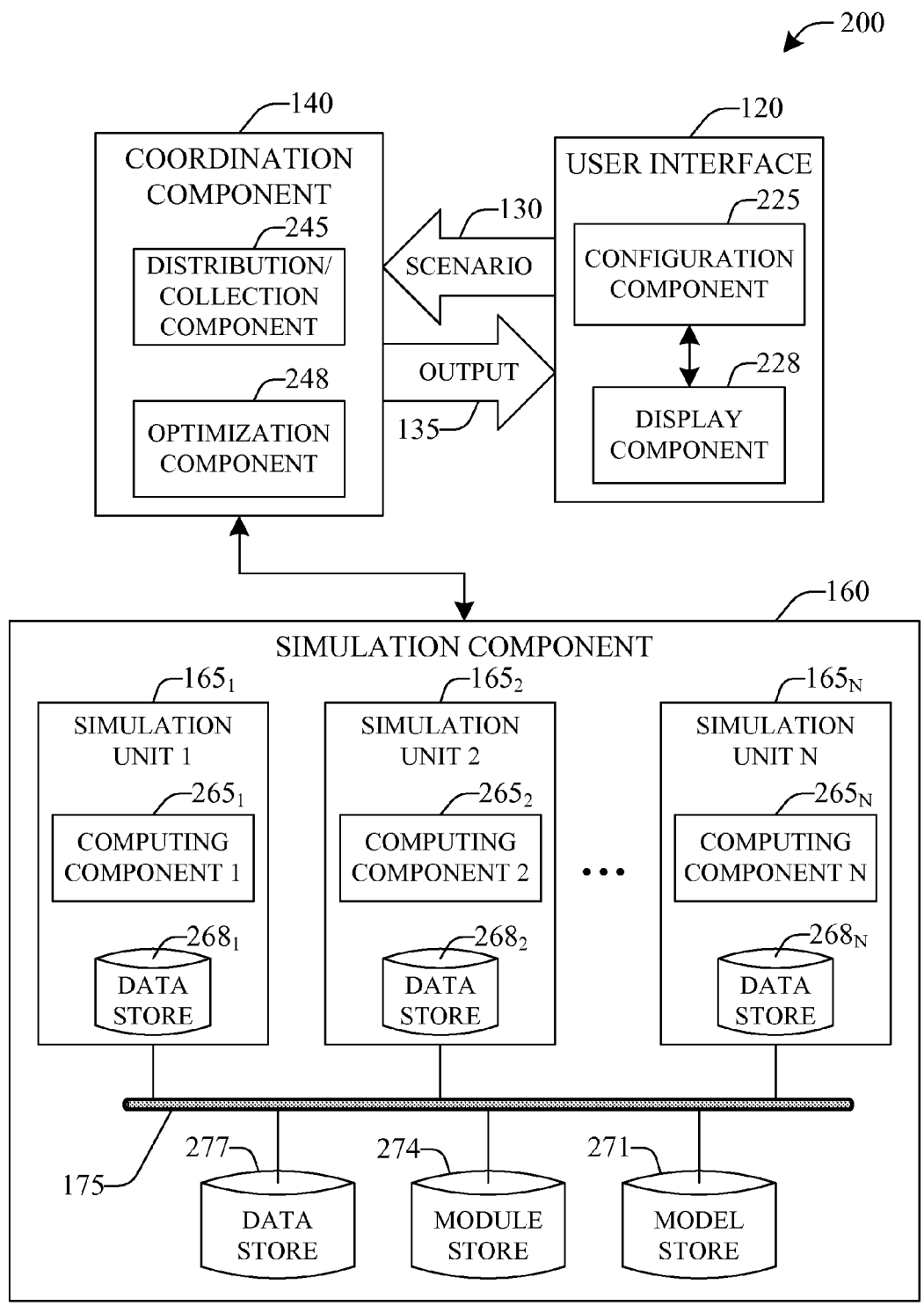
FIG. 2 illustrates an example embodiment of a system that facilitates distributed simulation according to an aspect of the subject specification.
Figure 3A:
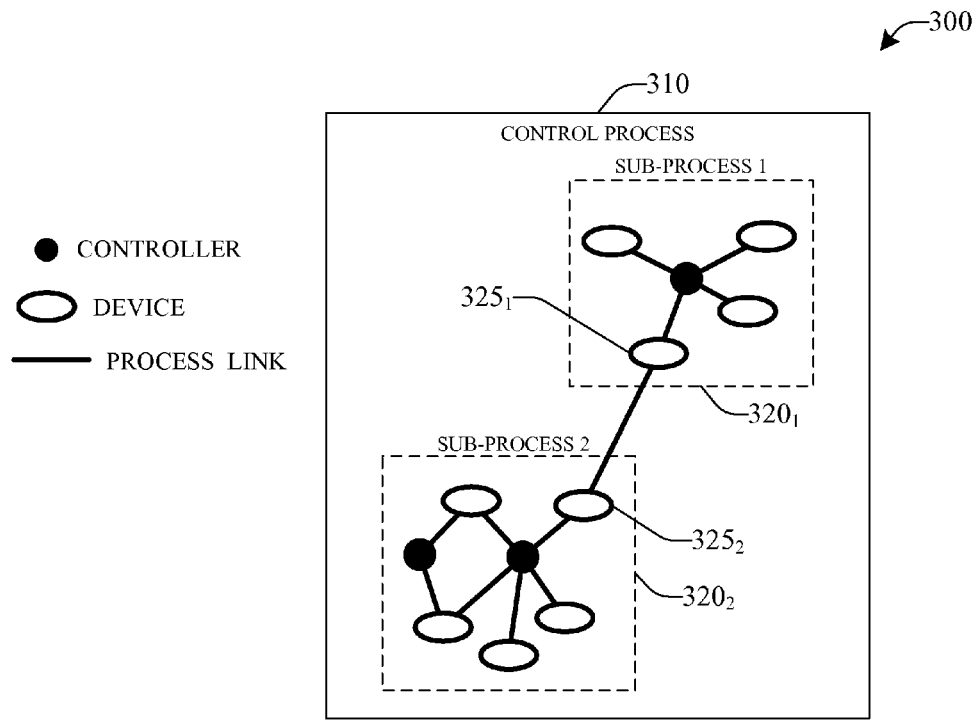
FIGS. 3A and 3B are schematic illustrations of groups of devices and controllers associated with control sub-processes, and computating resources scheduled sub-processes.
Figure 3B:
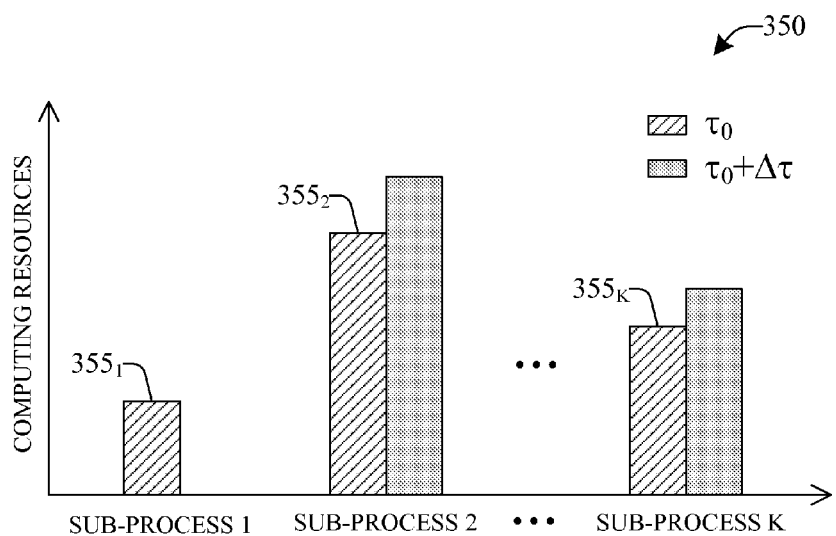

FIG. 2 illustrates an example embodiment 200 of a system that facilitates distributed simulation. The system operates in substantially similar manner as system 100, however, embodiment 200 displays an architecture that affords implicit synchronization of tasks—e.g., synchronization of portions of a simulation executing in simulation units $165_1$-$165_N$—through (i) balancing computing load, and (ii) dynamic re-balancing of computing load of simulation component 160. Succinctly, feature (i) can correspond to deploying a simulation of a system (e.g., an industrial control system) on disparate simulation units (e.g., computing resources) according to computational demands of simulating portions of the system; and (ii) can correspond to redistributing computational resources according to changes in the computational demand of said portions. Next, the architecture of embodiment 200 is presented and aspects (i) and feature (ii) are discussed. It is noted that reference to FIGS. 3A and 3B is made where appropriate for purposes of illustrations.

As discussed above, a distributed simulation begins with a scenario, and user interface 120 allows an operator or a client application to set up such scenario. A configuration component 225 coupled to a display component 228 enables a user to (a) provide the constituents of a system to be simulated, e.g., devices and controllers in an industrial control system, and a logic for the simulation, such as possible states of a device and drivers for such states, relative hierarchy of such states (e.g., a device state C can only be reached through attaining first either device state A or B), network topology of networked devices, and so forth; (b) select the type of industrial process to be simulated (e.g., discrete process, batch process), substances involved or products to be manufactured, as well as the type and size of facility corresponding to the process, e.g., car assembly; (c) determine the type and number of devices, which are consistent with the process for which the scenario is being developed, and type and number of controllers (digital or analog (in case of simulating a system with legacy equipment)); and (d) tolerances related to operational limits, e.g., fault timers, limiting temperatures, pressures, currents, weights, concentration of chemicals (e.g., relevant in a model of a pharmaceutical system), and so forth. Configuration component 225 can check for logical as well as programmatic inconsistencies in the scenario, such as conflicting devices and set point limits, failure to meet regulations (if the model belongs in a highly regulated industry), and so forth. When inconsistencies are identified, they can be reported in display component 228 for operator's consideration.

Display component 228 also presents the results of simulations. Depending on the simulation, display component 228 can render an animation and display graphics and parameter listings simultaneously, or sequentially, depending on user input in response to the animated results. While a simulation is executing, or computing, status data can be rendered in display component 228, to alert an operator of the level of completion of the simulation. Moreover, as discussed below, the display component 228 can present computing load of simulation units 1651-165N employed in a distributed simulation. Furthermore, such display component 228 can simulate end-user characteristics (such as display of control knobs, alarm lights/sounds, and so forth) of one or more devices, one or more controllers, or any combination thereof. In this manner, which is similar to the instance in which simulation component 160 simulates the operation of a vehicle (plane, car, train, etc.), display component 228 presents information according to the typical information a user would be provided with when operating such a device or controller.

As discussed in connection with FIG. 1, user interface 120 is coupled to coordination component 140, which is an intermediary component that casts a scenario (e.g., scenario 130) into a model that can be computationally executed by simulation component 160. Models in accordance with an aspect of the subject innovation are based on modules that provide functionality, e.g., modules are code objects with data structures and operators that represent a specific functional aspect of a scenario (e.g., scenario 130). Examples of modules are: control modules, I/O modules, fault time modules, packaging modules, etc. A particular set of modules employed in a distributed simulation depends on the relationships between the components to be modeled (see below), and the logic of such relationships. A distribution/collection component 245 within coordination component 140 can (a) deploy a simulation on simulation units $165_1$-$165_N$, by scheduling computing tasks for said units, and storing algorithms pertinent to such scheduling (e.g., distribution of portions of a simulation for execution in a simulation unit 165); (b) share data, such as system output variables, across simulation units $165_1$-$165_N$, and thus across simulated components; and (c) collect simulation results from each simulation unit $165_1$-$165_N$. Items (b) and (c) can be accomplished via stored algorithms (not shown) for control of communication/synchronization among multiple simulation units $165_1$-$165_N$. Optimization component 248 can generate code, and identify relationship among components described by the model generated by coordination component 140. Such aspects are discussed below in connection with implicit synchronization (i).

Simulation component 160 conducts a distributed simulation according to tasks scheduled by distribution/collection component 245. Each of the simulation units $165_1$-$165_N$ can include a computing component 265 (where such computing components possibly have different architectures) and a data store 268, executes instructions, and generates and processes data. Computing unit 265 and data store 268 can be considered the computing resources of a simulation unit. Different architectures of simulation units $165_1$-$165_N$ can allow customized scheduling, with some tasks executing in simulation units optimized for memory intensive "jobs" (a computation), while other tasks can execute in computing units more appropriate for processing intensive jobs.

Due to the distributed nature of the computing resources in simulation component 160, groups of one or more computing resources can execute a portion of a simulation according to one or more of paradigms for parallel computing. Moreover, distributed simulation demands communication and, possibly, synchronization among the multiple computational resources ($265_1$-$265_N$ and $268_1$-$268_N$). As mentioned above, in connection with FIG. 1, communication can be accomplished via network 175, which typically depends on the specific architecture of a computing unit 265 and a data store 268. It should be appreciated that to accommodate disparate computing resources, network 175 can be a heterogeneous network.

Data relevant for conducting the simulation (e.g., parameters describing operational limits of devices and controllers, technical specifications of said devices and controllers, etc.), and results generated by the distributed simulation can be stored locally in a data store 268, or stored in data store 277 over network 175. It should be appreciated that storage in data store 277 is managed by distribution/collection component 245. Legacy data can also be stored in data store 277, as well as log reports generated by simulation component 160, or components linked to it (e.g., coordination component 140). In an aspect, instructions for a model of a scenario reside in a code module store 274. It should be appreciated that once coordination component 140 determines a model related to a received scenario 130, the model can be stored in model store 271, and accessed asynchronously at a later time by coordination component 140 and/or components linked to it. Models successfully employed in a distributed simulation become legacy models, which can be used as a part of a new distributed simulation, or can be used as training sets for machine learning, in connection with optimization component 248. Newly configured models (via coordination component 140) can be stored in model store 271.

In connection with implicit synchronization (i), optimization component 248 facilitates analysis of the relationships between the one or more components of the scenario being modeled (e.g., an industrial control system) to infer that one or more groups of components are operationally coupled. Operationally coupled components are components that take part in a specific portion of the modeled process (e.g., a sub-process) conveyed in a scenario, but are nearly independent (weakly coupled) of other portions of said process. As a result of such analysis, sub-processes, which are weakly coupled, can be identified and deployed for simulation in disparate simulation units with disparate resources (e.g., memory, number of processors and/or computing threads, etc.), such that execution of simulation of the sub-processes can be substantially synchronized. FIG. 3A is a schematic illustration 300 of an industrial control system that controls an example process 310, in which two example sub-processes $320_1$ and $320_2$ are weakly coupled by a single process link 325 among two devices (e.g., device $335_1$ can be a conveyor belt and device $335_2$ can be a furnace, the conveyor belt carrying freshly painted tiles to an oven for surface curing).

In order to attain implicit synchronization employing (i), coordination component 140 can schedule one, two or more computing tasks to simulate a sub-process according to the computational demand of simulating such a sub-process. FIG. 3B is a schematic illustration 350 of the level of computing resources scheduled for weakly coupled sub-processes $\{1, \ldots, K\}$. Computational resources $355_1$-$355_K$ vary among sub-processes as a function of the estimated computing load of each process. By adjusting the computing resources scheduled for the sub-processes, simulation of each sub-process can proceed at comparable execution speed. The latter can effectively result in a (quasi) synchronized distributed simulation.

In a related aspect to implicit synchronization described above, computing resources can be re-scheduled, by distribution/collection component 245, once a simulation of a sub-process completes. FIG. 3B illustrates reallocation of the computing resources originally scheduled for sub-process 1. Such reallocation leads to newly re-scheduled resources $358_2$-$358_K$ at an instant $\tau_0+\Delta\tau$ (where $\Delta\tau$ can be the run-time to complete simulation associated with sub-process 1), and can take place according to a projected computational demand for completing those sub-processes that remain active in a distributed simulation.

It is noted that optimization component 148 can estimate the computational demand to simulate each of the sub-processes $\{1, \ldots, K\}$ based at least on the degree of relationships a particular sub-process exhibits; for instance, rich relationships can indicate a high level of data dependence, and thus can convey the need for processor-intensive resources (e.g., fast processors). Alternatively, or in addition, estimation of computing load can be accomplished by performing prototyping simulations (simulations with simplifying assumptions) of isolated sub-processes. Coordination component 140 can output computing load analysis to display component 228.

It should be appreciated that optimization component 248 can also determine that one or more relationships among components being simulated are inhibitors of parallel computing. In such a case, optimization component 248 can infer a partially restructured process, with substantially the same functionality as the process originally intended for simulation, but with component relationships such that inhibitors for parallel computing are mitigated. In an aspect, code for such restructured processes can be generated by optimization component 248. Code generation can consist of redesigning the set of modules employed in the simulation to attain an optimal logic in the industrial process delineated in scenario 130, or it can consist of selecting alternative modules that require less communication between tasks. Optimization component 248 can generate the code for execution within a parallel computing paradigm (e.g., single-instruction-multiple-data, multiple-instruction-single-data, and multiple-instruction-multiple data). Such code can be generated in a high-level programming language (e.g., Microsoft® C#, Java, Delphi, Microsoft® Visual Basic, C++, Perl), device or controller code language (Verilog, assembly code, etc.), or domain specific simulation languages such as SIMAN.

As used above and hereinafter, the term "infer" refers to the ability to reason or draw conclusions about the current or future conditions of a system, based on existing information about the system. Artificial intelligence (AI) can be employed to identify a specific context or action, or generate a probability distribution of specific conditions (e.g., logic in a simulated industrial process that is conductive to time scaling) of a system without human intervention. Artificial intelligence relies on applying advanced mathematical algorithms—e.g., decision trees, neural networks, regression analysis, cluster analysis, genetic algorithm, and reinforced learning—to a set of available data (information) on the system. In particular, an AI-based component, such as optimization component 275, can employ one of numerous methodologies for learning from data and then drawing inferences from the models so constructed, e.g., hidden Markov models (HMM) and related prototypical dependency models, more general probabilistic graphical models, such as Bayesian networks, e.g., created by structure search using a Bayesian model score or approximation, linear classifiers, such as support vector machines (SVMs), non-linear classifiers, such as methods referred to as "neural network" methodologies, fuzzy logic methodologies, and other approaches that perform data fusion, etc.) in accordance with implementing various automated aspects described herein.

Figure 4:
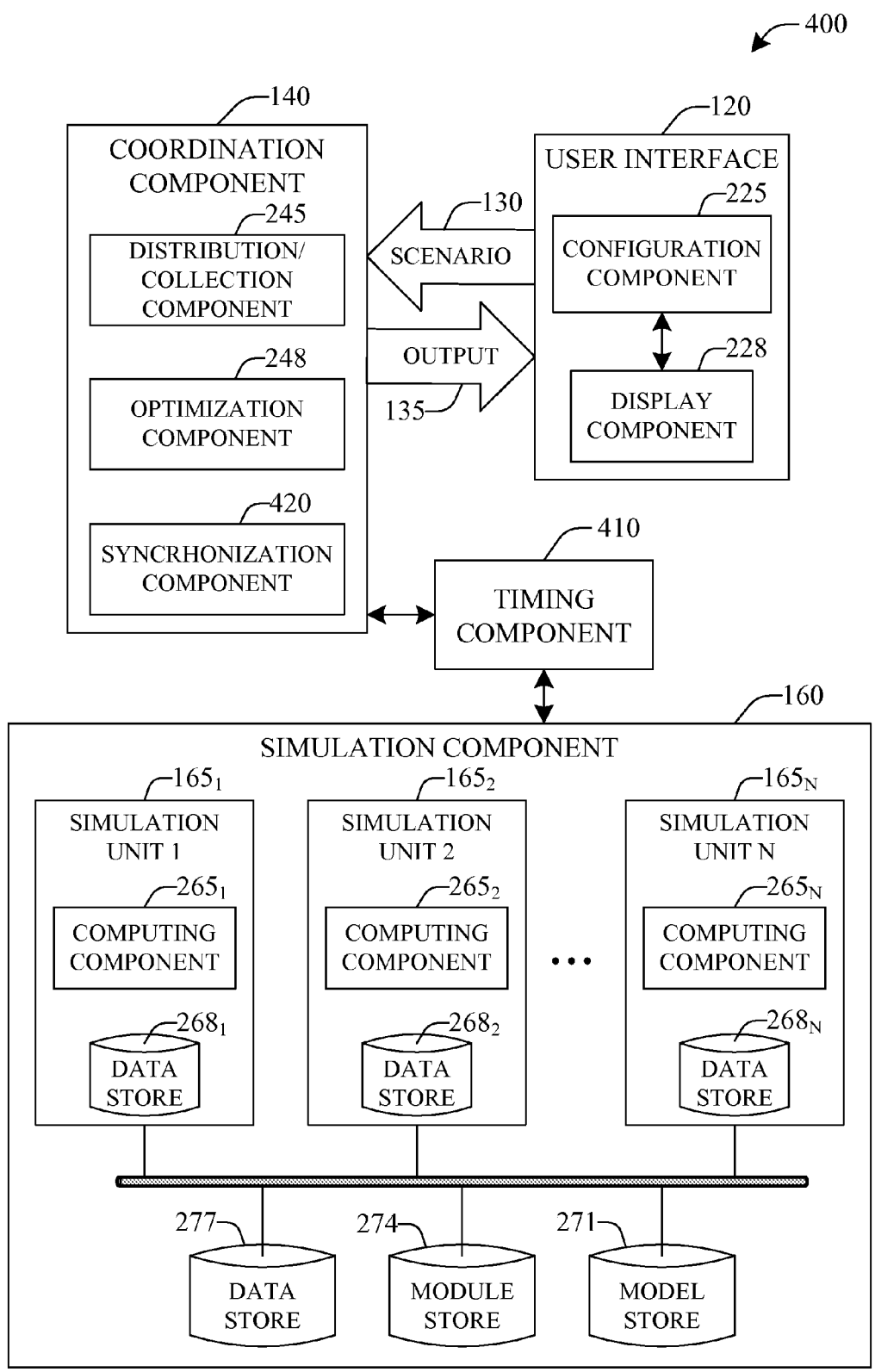
FIG. 4 illustrates an embodiment of a system that facilitates distributed simulation with explicit execution time management according to an aspect of the subject innovation.

As discussed above, the relationship between one or more controllers and one or more devices can indicate possible deployment strategies to perform a distributed simulation. An alternative, or an addition, to those strategies can be based on computational bottlenecks to simulate a system (e.g., an industrial control system), and increasing or decreasing execution time of a portion of a distributed simulation. FIG. 4 illustrates an embodiment 400 of a system that facilitates distributed simulation with explicit execution time management. Embodiment 400 operates substantially in the same manner as embodiment 200, but it incorporates a timing component 410 and a synchronization component 420. Such components couple coordination component 140 and distributed simulation component 160. Timing component 410 can decrease or increase execution time of a simulation and it can operate on portions of a distributed simulation, such as those portions executing in simulation units $165_1$-$165_N$. Synchronization component 420 is locked to a time source reference such as the clock of optimization component 248 or other time reference, and thus provides a synchronized time base for portions of simulations. The time reference is termed herein "master clock." In addition, synchronization component 420 monitors execution times with respect to the master clock and directs timing component to speed up or slow down specific portions of a distributed simulation.

To advantageously exploit timing component 410, computational bottlenecks—e.g., portions of the simulations that require substantial resources, and/or portions of the process that require access to multiple data generated in disparate portions of the process that can executing at disparate speeds in a simulation—are first identified and a distributed simulation is deployed accordingly. Portions corresponding to one or more bottlenecks are sped up or slowed down employing timing component 410.

Prototyping simulation(s) of a full model describing a process conveyed in a scenario (e.g., scenario 130) can be performed by optimization component 248. From such simulation(s), computational bottlenecks are uncovered. Similarly, prototyping simulation of one more components can be conducted. Information gathered in a prototyping simulation can be conveyed in display component 228 for a user to reconfigure the simulated process, or for verification purposes in connection with integrity of the distributed simulation (for example, a user can configure a scenario with known computational bottlenecks and verify those bottlenecks with the ones predicted by the prototyping simulation). Bottlenecks can be mapped to devices and controllers originating them, and those portions of the simulated system can be distributed in disparate computing units, employing substantial computing resources. In such a manner, distribution/collection component 245 can schedule tasks associated with a simulation of a model according to uncovered computational bottlenecks and available computational resources $265_1$-$265_N$ and $268_1$-$268_N$. Such deployment can result in a sped up simulation as a result of addressing extant computational bottlenecks.

To further improve any computational gains resulting from selective computing resource allocation for manipulating bottlenecks, the timing component 410 can be employed to speed up and slow down portions of a simulation of one or more components of an industrial control system according to the severity of bottleneck(s) (which can be measured, for example, in terms of computational resources required to address such bottleneck; e.g., memory, synchronization barriers, etc.). Such an explicit synchronization can result in enhance utilization of distributed simulation component 160. Various possibilities exists for slowing down a simulation; for instance, it can be accomplished by sending a control data-packet over network 175 to a simulation unit not involved in substantial computing, e.g., coordination component 140, resuming execution after a predetermined pause interval has elapsed, when the data packet is returned to the originating simulation unit. Next, the possibility to speed up portions of a distributed simulation, and attain synchronization in distributed simulations, is described.

In connection with strategies for time management mentioned above, an accelerated execution can arise from an adaptive time step with feedback algorithm (ATSWFA) described herein. Such algorithm is based on event driven simulations of multi-state components. ATSWFA can remove computational bottlenecks associated with state propagation that are pseudopassive. A pseudopassive state propagation can be one that requires rare, asynchronous control events. Examples of pseudopassive propagation include: filling a mixing tank or beverage container, conveyor belt transportation, paint drying stage in a car assembly line, etc. Such processes can need active control in the event a fault timer issues an alarm. Considering the case of filling a beverage container, the process need not require active control unless a dispenser issues a fault timer indicating the dispenser failed to energize or de-energy (see FIG. 5). In other words, pseudopassive propagation can be a synchronous blocking sub-process, albeit control thereof can be asynchronous. ATSWFA can exploit the pseudopassive nature of the state propagation to accelerate simulation steps as discussed below.

Figure 5:
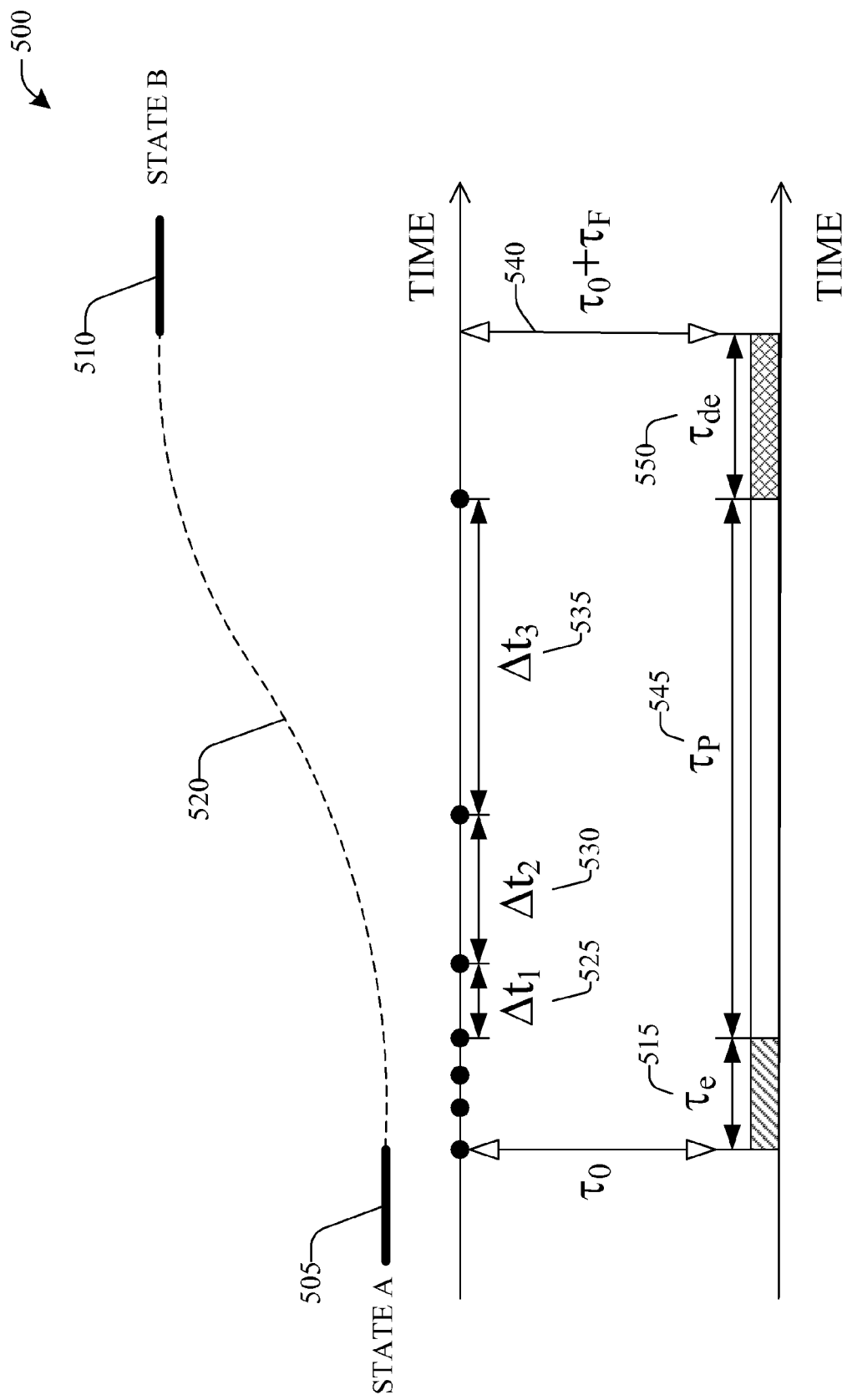
FIG. 5 is a schematic illustration of state propagation between states A and state B of a device, and time management.

FIG. 5 illustrates a diagram 500 of state propagation between State A 505 and State B 510 of a device D (not shown). To simplify the presentation of the principle of operation of ATSWFA, and not by way of limitation, an example process is considered; namely, filling a mixing tank (e.g., device D). State A 505 can correspond to tank empty and State B 510 to tank full. It is readily apparent that in idealized conditions, filling the mixing tank will depend strictly on the fluid flux of a valve (the valve opens to fill tank; not shown) after it has been energized ($\tau_e$ 515 period of time). Thus, filling the tank need not be controlled and the pseudopassive propagation can be modeled as an instantaneous transition: Given a slope of curve AB 520 and absence of de-/energize faults, a simulation can predict deterministically the time at which propagation is complete, e.g., the tank is filled. In a real world situation, however, certain level of control is necessary to monitor the valve (a secondary component to the propagation) indeed maintains a constant flux. Yet, due to the pseudopassive nature of the propagation, control events can be spaced in time according to the feedback from the valve: If after successive control events that measure the flow passing through valve, successive values of the flow are within a tolerance (e.g., flux remains substantially the same) determined by noise introduced by different environmental factors, faulty electronics, possibly filling the tank with a stream of fluid in a turbulent regime, and other factors, a forthcoming control event can be delayed by time offset δ. If the forthcoming control event measures the same flux, a subsequent control event can be delayed by δ', and so forth.

The information regarding lack of active control can be fed back to a simulation component (e.g., simulation component 140), which can subsequently adapt the time step Δt to reflect the absence of active control—e.g., $\Delta t_1$ 525, $\Delta t_2$ 530, and $\Delta t_3$ 535, which span the pseudopassive time span $\tau_P$ 540. Thus, actual number of steps (3 in case illustrated in FIG. 5) necessary to propagate the time $\tau_F$ 540 (which includes de-energize time $\tau_{de}$ 550) associated with changing the mixing tank from empty (State A 505) to full (State B 510) is reduced, when compared to an non-adaptive time step method, as feedback from the controller (physical or simulated) probing the valve indicates no active control is needed. It should be appreciated that ATSWFA involves active feedback from a controller and/or actual devices (physical or simulated) in order to adapt the time step of the simulation. ATSWFA can result in an accelerated simulation by shortening the simulation of pseudopassive time propagation. It should be appreciated that ATSWFA can be incorporated into timing component 410 within an Adaptive Time Step with Feedback propagation component (not shown).

Figure 6:
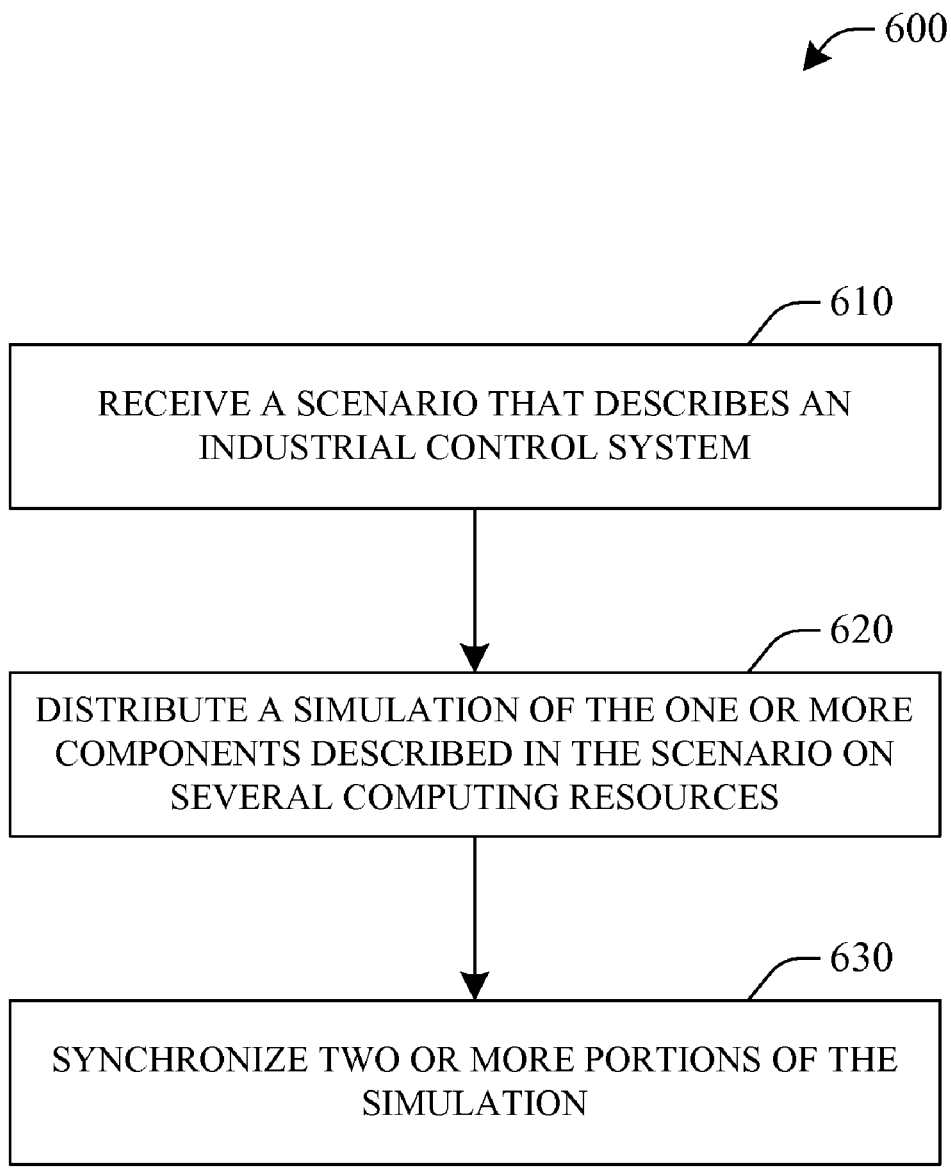
FIG. 6 presents a flowchart of a method for simulating an industrial control system according to an aspect of the subject specification.
Figure 7:
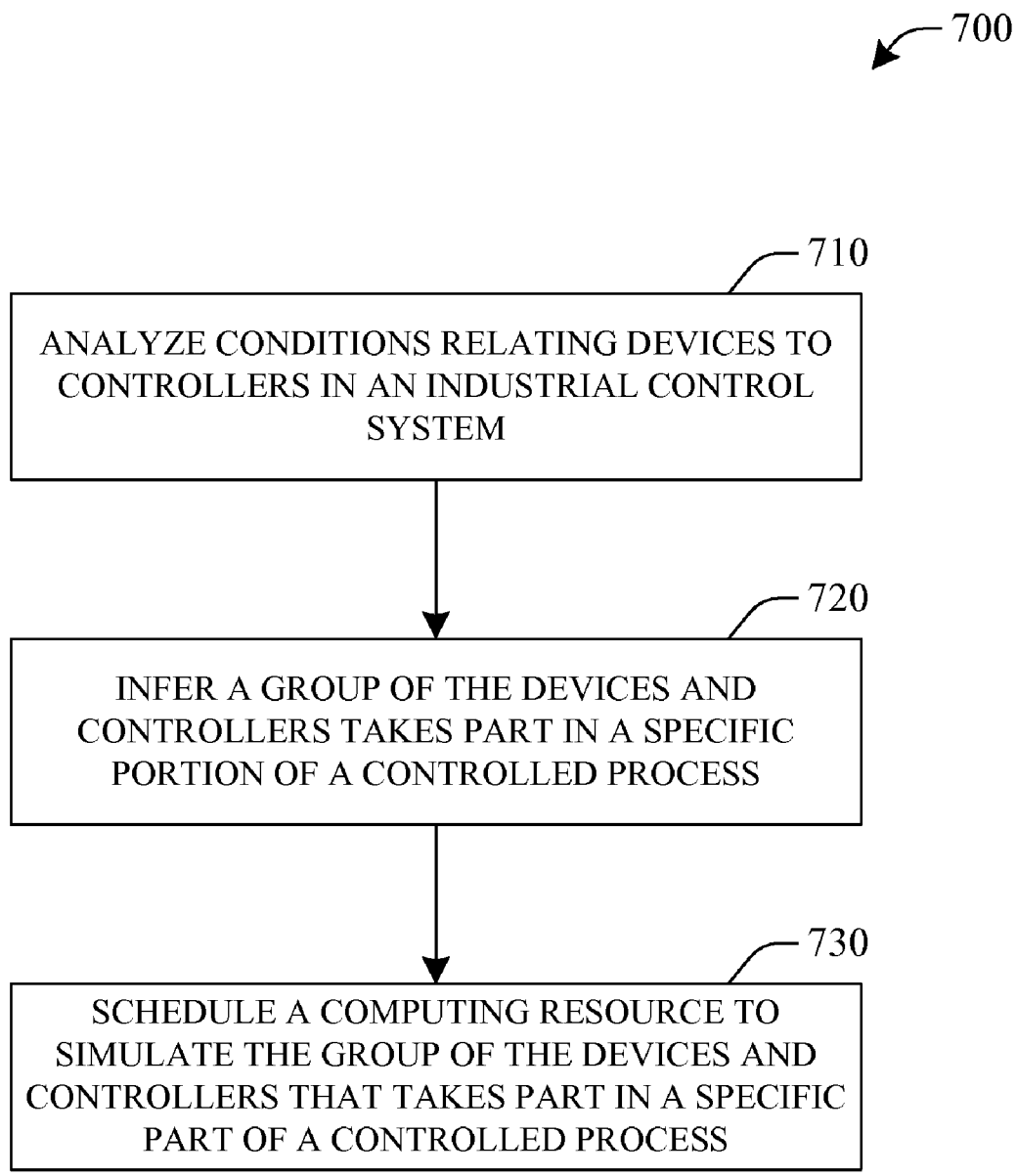
FIG. 7 presents a flowchart of a method for scheduling computing resources on a distributed simulation according to an aspect of the subject disclosure.
Figure 8:
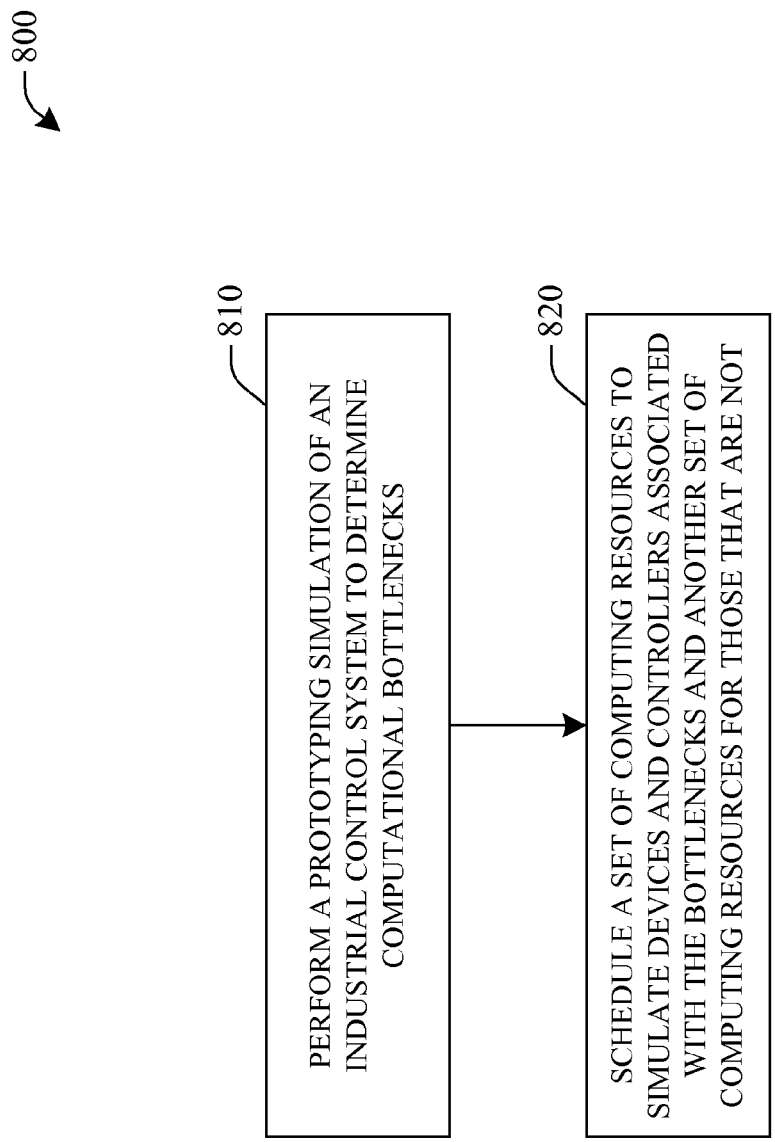
FIG. 8 presents a flowchart of a method for scheduling computing resources on a distributed simulation according to an aspect of the subject specification.

In view of the example systems shown and described above, methodologies that may be implemented in accordance with the disclosed subject matter, will be better appreciated with reference to the flowcharts of FIGS. 6-8. While, for purposes of simplicity of explanation, the methodologies are shown and described as a series of blocks, it is to be understood and appreciated that the claimed subject matter is not limited by the number or order of blocks, as some blocks may occur in different orders and/or concurrently with other blocks from what is depicted and described herein. Moreover, not all illustrated blocks may be required to implement the methodologies described hereinafter. It is to be appreciated that the functionality associated with the blocks may be implemented by software, hardware, a combination thereof or any other suitable means (e.g., device, system, process, component, . . . ). Additionally, it should be further appreciated that the methodologies disclosed hereinafter and throughout this specification are capable of being stored on an article of manufacture to facilitate transporting and transferring such methodologies to various devices. Those skilled in the art will understand and appreciate that a methodology could alternatively be represented as a series of interrelated states or events, such as in a state diagram.

FIG. 6 presents a flowchart of a method 600 for simulating an industrial control system according to an aspect of the subject specification. At act 610, a scenario that describes an industrial control system is received. Such a scenario can be interpreted as a plurality of conditions relating two or more components in the industrial control system. Such conditions in a scenario characterize interactions between such two or more components. In an aspect, interactions are dictated by an industrial process that is controlled by the system for which a scenario is received in act 610. Such interactions can be relationships between devices such as a furnace and a thermostat, or bottle filler and a bottle capper. It should be appreciated that relationships can be more complex than two-body relationships or interactions. Additionally, relationships/interactions among one or more devices and one or more controllers can be established in the industrial control system as a part of the controlled process.

At act 620, a simulation of the one or more components of the industrial control system described in the scenario is distributed on several computing resources (e.g., computers). It should be appreciated that the simulation relies on a formal (mathematical or logical) model perform the simulation. Such model can be selected primarily based on the operational characteristics of the one or more components to be described and their interactions. In an aspect, a model is also selected so as to describe a behavior of the one or more devices, controllers, or a combination thereof. Behavior as used herein can encompass equipment (e.g., a device such as a robotic arm, or a furnace) response as part of a process controlled by the industrial control systems characterized in a scenario (e.g., scenario received at act 610). Such responses include triggering alarms, setting up electric fields, controlling temperatures, igniting motors, and so on.

At act 630 two or more portions of the distributed simulation are synchronized. Synchronization allows a portion of a distributed simulation to transmit data to, or receive data from, another portion of the simulation without substantial delays. In an aspect, synchronizing two or more portions of a distributed simulation can consist of scheduling (or allocating) computational resources to such portions resulting in substantially similar execution times. In such approach, computing resources are managed to attain synchronization. In another aspect, synchronization can be accomplished by managing execution times, wherein the execution time of a portion of the distributed simulation is sped up (slowed down), while another portion is slowed down (sped up).

FIG. 7 presents a flowchart of a method 700 for scheduling computing resources to perform a distributed simulation of an industrial control system according to a common operability. At act 710, conditions relating one or more devices to one or more controllers are analyzed. Such an analysis can become relevant when complicated legacy industrial control systems are to be simulated. At act 720, it is inferred that a group of devices and controllers takes part in a specific, nearly independent portion of a controlled process. Such portion of the controlled process is termed a sub-process, and is typically weakly coupled to other groups of devices and controllers in other sub-processes. At act 730, such a group of devices operating in a specific, nearly independent portion of a controlled process is assigned a computing resource (e.g., processor, execution threads, memory, . . . ). In an aspect, such nearly-independent portions of a controlled process can be simulated in dedicated resources, as the specificity of the sub-process in which devices and controllers are involved mitigates the presence of highly dependent data in the distributed simulation.

FIG. 8 presents a flowchart of a method 800 for scheduling computing resources on a distributed simulation of an industrial control system. At act 810 a prototyping simulation is performed in order to determine one or more computational bottlenecks. The prototyping simulation of act 810 is a simplified simulation of the industrial control system. As an example, in such a simulation alarms and granular descriptions of complex devices and controllers can be disabled. Such descriptions at a prototyping level of simulation are simplified with the object of capturing robust, salient aspects of the system, and estimating the computational resources necessary for conducting simulations. In particular, computational bottlenecks can be mapped to devices and controllers responsible for originating such bottlenecks. At act 820, disparate computing resources are allocated to simulate those devices and controllers in the industrial control system that are associated with the computational bottlenecks and those that are not.

Figure 9:
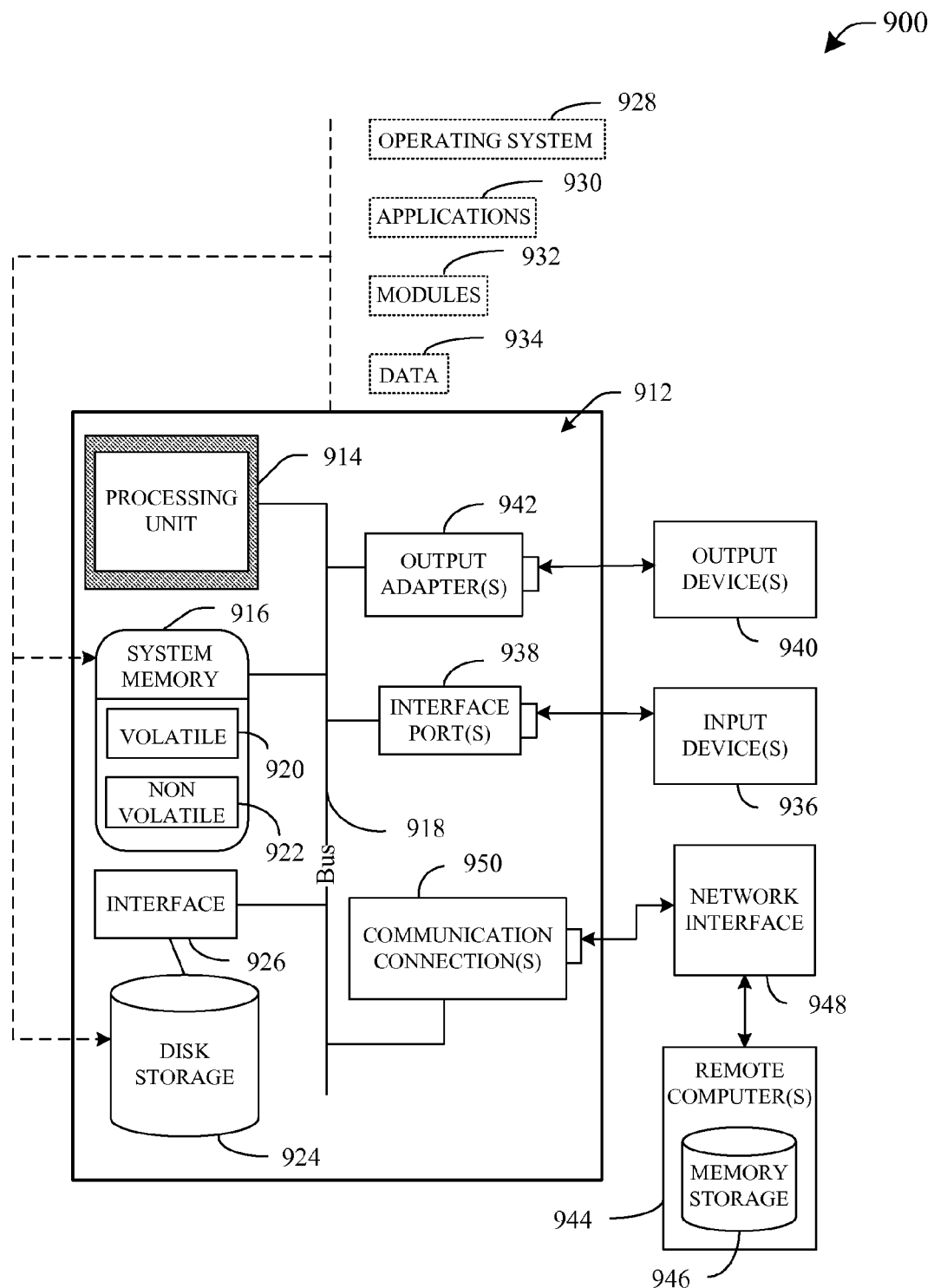
FIG. 9 illustrates an example environment for implementing various aspects of the claimed subject matter.
Figure 10:
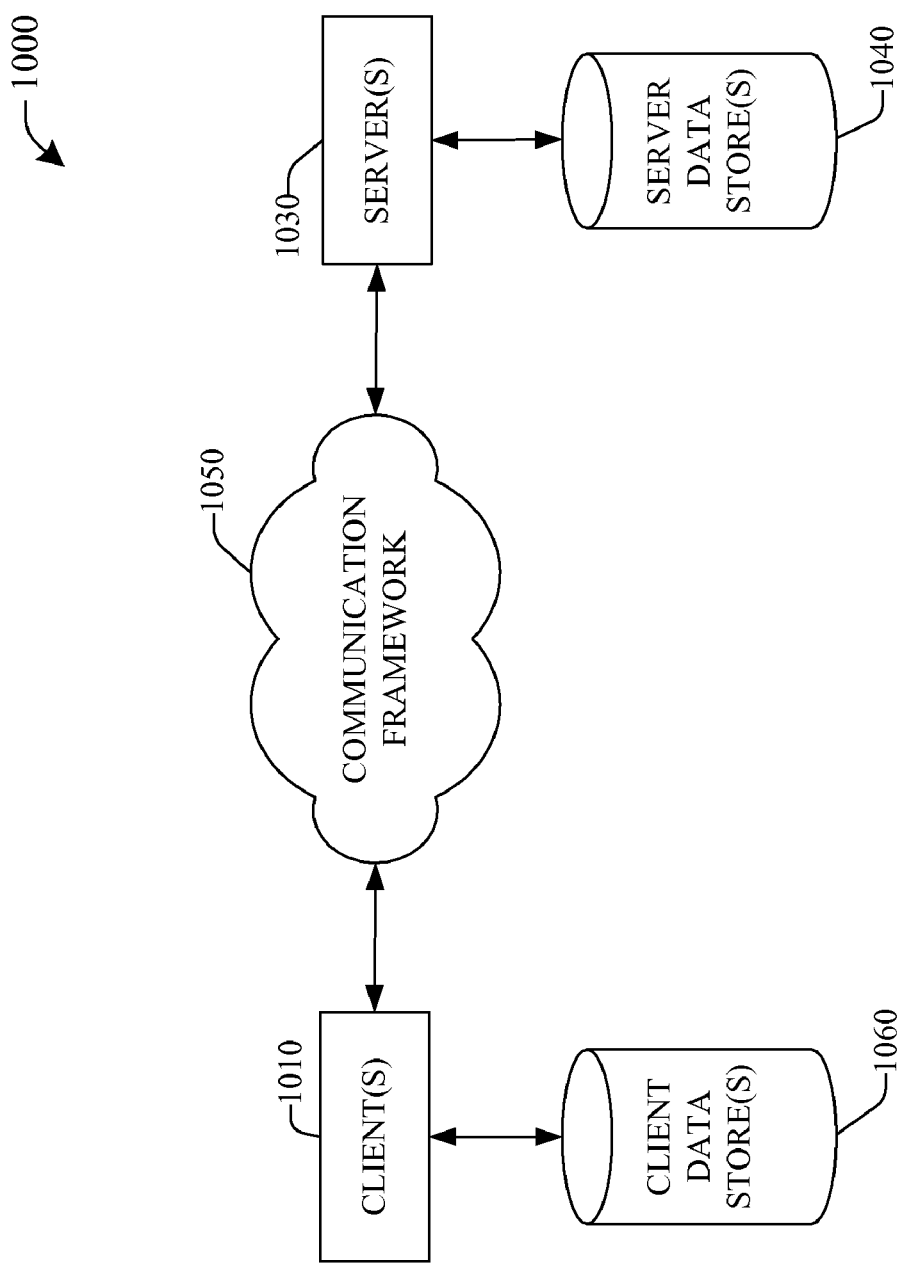
FIG. 10 is a schematic block diagram of a sample-computing environment with which the subject invention can interact.

In order to provide a context for the various aspects of the disclosed subject matter, FIGS. 9 and 10 as well as the following discussion are intended to provide a brief, general description of a suitable environment in which the various aspects of the disclosed subject matter may be implemented. While the claimed subject matter has been described above in the general context of computer-executable instructions of a computer program that runs on a computer and/or computers, it can be recognized that the claimed subject matter also may be implemented in combination with other program modules. Generally, program modules include routines, programs, components, data structures, etc. that perform particular tasks and/or implement particular abstract data types. Moreover, it can be appreciated that the inventive methods may be practiced with other computer system configurations, including single-processor or multiprocessor computer systems, mini-computing devices, mainframe computers, as well as personal computers, hand-held computing devices (e.g., personal digital assistant (PDA), phone, watch . . . ), microprocessor-based or programmable consumer or industrial electronics, and the like. The illustrated aspects may also be practiced in distributed computing environments where tasks are performed by remote processing devices that are linked through a communications network. In a distributed computing environment, program modules may be located in both local and remote memory storage devices.

With reference to FIG. 9, an exemplary environment 910 for implementing various aspects of the claimed subject matter includes a computer 912. The computer 912 includes a processing unit 914, a system memory 916, and a system bus 918. The system bus 918 couples system components including, but not limited to, the system memory 916 to the processing unit 914. The processing unit 914 can be any of various available processors. Dual microprocessors and other multiprocessor architectures also can be employed as the processing unit 914.

The system bus 918 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCM-CIA), and Small Computer Systems Interface (SCSI).

The system memory 916 includes volatile memory 920 and nonvolatile memory 922. The basic input/output system (BIOS), containing the basic routines to transfer information between elements within the computer 912, such as during start-up, is stored in nonvolatile memory 922. By way of illustration, and not limitation, nonvolatile memory 922 can include read only memory (ROM), programmable ROM (PROM), electrically programmable ROM (EPROM), electrically erasable PROM (EEPROM), or flash memory. Volatile memory 920 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 912 also includes removable/non-removable, volatile/non-volatile computer storage media. FIG. 9 illustrates, for example, a disk storage 924. Disk storage 924 includes, but is not limited to, devices like a magnetic disk drive, floppy disk drive, tape drive, Jaz drive, Zip drive, LS-100 drive, flash memory card, or memory stick. In addition, disk storage 924 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 924 to the system bus 918, a removable or non-removable interface is typically used such as interface 926.

It is to be appreciated that FIG. 9 describes software that acts as an intermediary between users and the basic computer resources described in suitable operating environment 900. Such software includes an operating system 928. Operating system 928, which can be stored on disk storage 924, acts to control and allocate resources of the computer system 912. System applications 930 take advantage of the management of resources by operating system 928 through program modules 932 and program data 934 stored either in system memory 916 or on disk storage 924. It is to be appreciated that the subject invention can be implemented with various operating systems or combinations of operating systems.

A user enters commands or information into the computer 912 through input device(s) 936. Input devices 936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 914 through the system bus 918 via interface port(s) 938. Interface port(s) 938 include, for example, a serial port, a parallel port, a game port, and a universal serial bus (USB). Output device(s) 940 use some of the same type of ports as input device(s) 936. Thus, for example, a USB port may be used to provide input to computer 912, and to output information from computer 912 to an output device 940. Output adapter 942 is provided to illustrate that there are some output devices 940 like monitors, speakers, and printers, among other output devices 940, which require special adapters. The output adapters 942 include, by way of illustration and not limitation, video and sound cards that provide a means of connection between the output device 940 and the system bus 918. It should be noted that other devices and/or systems of devices provide both input and output capabilities such as remote computer(s) 944.

Computer 912 can operate in a networked environment using logical connections to one or more remote computers, such as remote computer(s) 944. The remote computer(s) 944 can be a personal computer, a server, a router, a network PC, a workstation, a microprocessor based appliance, a peer device or other common network node and the like, and typically includes many or all of the elements described relative to computer 912. For purposes of brevity, only a memory storage device 946 is illustrated with remote computer(s) 944. Remote computer(s) 944 is logically connected to computer 912 through a network interface 948 and then physically connected via communication connection 950. Network interface 948 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 950 refers to the hardware/software employed to connect the network interface 948 to the bus 918. While communication connection 950 is shown for illustrative clarity inside computer 912, it can also be external to computer 912. The hardware/software necessary for connection to the network interface 948 includes, for exemplary purposes only, internal and external technologies such as, modems including regular telephone grade modems, cable modems and DSL modems, ISDN adapters, and Ethernet cards.

FIG. 10 is a schematic block diagram of a sample-computing environment 1000 with which the subject invention can interact. The system 1000 includes one or more client(s) 1010. The client(s) 1010 can be hardware and/or software (e.g., threads, processes, computing devices). The system 1000 also includes one or more server(s) 1030. The server(s) 1030 can also be hardware and/or software (e.g., threads, processes, computing devices). The servers 1030 can house threads to perform transformations by employing the subject invention, for example. One possible communication between a client 1010 and a server 1030 can be in the form of a data packet adapted to be transmitted between two or more computer processes. The system 1000 includes a communication framework 1050 that can be employed to facilitate communications between the client(s) 1010 and the server(s) 1030. The client(s) 1010 are operably connected to one or more client data store(s) 1060 that can be employed to store information local to the client(s) 1010. Similarly, the server(s) 1030 are operably connected to one or more server data store(s) 1040 that can be employed to store information local to the servers 1030.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . optical disks [e.g., compact disk (CD), digital versatile disk (DVD) . . . ], smart cards, and flash memory devices (e.g., card, stick, key drive . . . ).

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . optical disks [e.g., compact disk (CD), digital versatile disk (DVD) . . . ], smart cards, and flash memory devices (e.g., card, stick, key drive . . . ).

Moreover, as used in the subject application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. What has been described above includes various exemplary aspects. It is, of course, not possible to describe every conceivable combination of components or methodologies for purposes of describing these aspects, but one of ordinary skill in the art may recognize that many further combinations and permutations are possible. Accordingly, the aspects described herein are intended to embrace all such alterations, modifications and variations that fall within the spirit and scope of the appended claims. Furthermore, to the extent that the term "includes" is used in either the detailed

What is claimed is:

1. A distributed simulation system, comprising:
at least one processor;
at least one memory communicatively coupled to the at least one processor, the at least one memory having stored therein computer-executable instructions to implement the system, including:
a simulation component configured to simulate a plurality of components associated with a controlled process of an industrial control system;
an optimization component configured to estimate computational demand to simulate a component of the plurality of components, wherein the optimization component is further configured to estimate the computational demand using a prototype simulation that employs simplified assumptions of the component based upon a degree of data dependence between the component and other components of the plurality of components.

2. The system of claim 1, wherein the simulation component includes two or more simulation units, each configured to execute a portion of a simulation.

3. The system of claim 2, further comprising a coordination component configured to schedule the two or more simulation units to perform a distributed simulation.

4. The system of claim 1, further comprising a timing component configured to increase or decrease execution time of the component.

5. The system of claim 4, wherein the timing component is further configured to employ an adaptive time step with feedback algorithm to speed up execution time of the component.

6. The system of claim 1, wherein the simulation component further comprises a storage component configured to store code modules to perform the simulation of the plurality of components of the industrial control system.

7. The system of claim 1, further comprising a distribution component configured to dynamically reassign simulation resources according to the estimated computational demand.

8. The system of claim 1, wherein the optimization component is further configured to analyze relationships between the plurality of components of the industrial control system to determine one or more relationships that inhibit parallel computing.

9. The system of claim 8, wherein the optimization component is further configured to infer a restructured process with substantially a same functionality as the controlled process, wherein the restructured process mitigates the one or more relationships that inhibit parallel computing.

10. The system of claim 8, wherein the optimization component is further configured to employ a prototyping simulation of two or more components of the industrial control system to determine at least one computational bottleneck that inhibits parallel computing.

11. The system of claim 10, further comprising a coordination component configured to schedule a first set of simulation units to simulate one or more components associated with the at least one computational bottleneck, and a second set of simulation units to simulate one or more components not associated with said at least one computational bottleneck.

12. A method for simulating an industrial control system, the method comprising:
receiving a model describing behavior of a plurality of industrial components associated with an industrial process;
estimating computational demand to simulate a component of the plurality of components based upon a degree of data dependence between the component and other components of the plurality of components, wherein the estimating the computational demand further comprises using a prototype simulation that employs simplified assumptions of the component;
distributing a simulation of the behavior of the plurality of industrial components among a plurality of computing resources based upon the estimated computational demand; and
executing the distributed simulation.

13. The method of claim 12, further comprising:
analyzing relationships between the plurality of industrial components including determining one or more relationships that inhibit parallel computing.

14. The method of claim 13, further comprising inferring a restructured process with substantially a same functionality as the industrial process, wherein the restructured process mitigates the one or more relationships that inhibit parallel computing.

15. The method of claim 14, further comprising:
performing a prototyping simulation of the plurality of industrial components to determine one or more computational bottlenecks; and
scheduling a first set of computing resources to simulate at least one industrial component associated with the one or more computational bottlenecks, and a second set of computing resources to simulate at least one industrial component not associated with said one or more computational bottlenecks.

16. The method of claim 12, further comprising synchronizing one or more portions of the distributed simulation by adapting a time step for speeding up or slowing down execution of one or more of said portions.

17. An apparatus that operates in an industrial environment, the apparatus comprising:
means for accessing a plurality of computational resources for simulating a plurality of components associated with an industrial process in an automated control system;
means for estimating computational demand to simulate a component of the plurality of components based upon a degree of data dependence between the component and other components of the plurality of components, wherein the estimating computational demand further comprises using a prototype simulation that employs simplified assumptions of the component;
means for deploying a simulation of the plurality of components on the plurality of computational resources in a distributed manner based upon the estimated computational demand; and
means for executing the distributed simulation.

18. A non-transitory computer-readable medium, comprising:
instructions for generating a computational model of a plurality of components associated with an industrial process in an industrial automation system;
instructions for estimating computational demand to simulate a component of the plurality of components as a function of a degree of data dependence between the component and other components of the plurality of components, wherein the estimating the computational demand further comprises using a prototype simulation that employs simplified assumptions of the component;
instructions for distributing a simulation of a behavior of the plurality of components onto a set of computing resources based upon the estimated computational demand;
instructions for executing the distributed simulation.

* * * * *